(12) United States Patent
Yang et al.

(10) Patent No.: US 7,525,185 B2
(45) Date of Patent: Apr. 28, 2009

(54) SEMICONDUCTOR DEVICE PACKAGE HAVING MULTI-CHIPS WITH SIDE-BY-SIDE CONFIGURATION AND METHOD OF THE SAME

(75) Inventors: Wen-Kun Yang, Hsin-Chu (TW); Diann-Fang Lin, Hukou Township, Hsinchu County (TW); Tung-Chuan Wang, Yangmei Town (TW); Hsien-Wen Hsu, Lujhou (TW); Chih-Ming Chen, Sinpu Township, Hsinchu County (TW)

(73) Assignee: Advanced Chip Engineering Technology, Inc., Hsinchu County (TW)

( * ) Notice: Subject to any disclaimer, the term of this patent is extended or adjusted under 35 U.S.C. 154(b) by 81 days.

(21) Appl. No.: 11/725,827

(22) Filed: Mar. 19, 2007

(65) Prior Publication Data

US 2008/0230884 A1 Sep. 25, 2008

(51) Int. Cl.
*H01L 23/02* (2006.01)
(52) U.S. Cl. ....................................... 257/678; 257/723
(58) Field of Classification Search ................. 257/678, 257/723
See application file for complete search history.

(56) References Cited

U.S. PATENT DOCUMENTS 4,709,468 A * 12/1987 Wilson ......................... 29/834
4,866,501 A * 9/1989 Shanefield ................... 257/684

* cited by examiner

*Primary Examiner*—Roy K Potter
(74) *Attorney, Agent, or Firm*—Abelman, Frayne & Schwab

(57) ABSTRACT

The present invention provides a semiconductor device package having multi-chips with side-by-side configuration comprising a substrate with die receiving through holes, connecting through holes structure and first contact pads on an upper surface and second contact pads on a lower surface of the substrate. A first die having first bonding pads and a second die having second bonding pads are respectively disposed within the die receiving through holes. The first adhesion material is formed under the first and second die and the substrate, and the second adhesion material is filled in the gap between the first and second die and sidewall of the die receiving though holes of the substrate. Further, bonding wires are formed to couple between the first bonding pads and the first contact pads, between the second bonding pads and the first contact pads. A dielectric layer is formed on the bonding wires, the first and second die and the substrate. A build up layer is form on the lower surface of substrate and the back side of first and second die.

16 Claims, 4 Drawing Sheets

SEMICONDUCTOR DEVICE PACKAGE HAVING MULTI-CHIPS WITH SIDE-BY-SIDE CONFIGURATION AND METHOD OF THE SAME

BACKGROUND OF THE INVENTION

1. Field of the Invention

This invention relates to a structure of semiconductor device package, and more particularly to a structure of semiconductor device package having multi-chips with side-by-side configuration and method of the same, the structure can reduce the package size and improve the yield and reliability.

2. Description of the Prior Art

In recent years, the high-technology electronics manufacturing industries launch more feature-packed and humanized electronic products. Rapid development of semiconductor technology has led to rapid progress of a reduction in size of semiconductor packages, the adoption of multi-pin, the adoption of fine pitch, the minimization of electronic components and the like. The purposes and the advantages of wafer level package includes decreasing the production cost, decreasing the effect caused by the parasitic capacitance and parasitic inductance by using the shorter conductive line path, acquiring better SNR (i.e. signal to noise ratio).

Because conventional package technologies have to divide a dice on a wafer into respective dice and then package the die respectively, therefore, these techniques are time consuming for manufacturing process. Since the chip package technique is highly influenced by the development of integrated circuits, therefore, as the size of electronics has become demanding, so does the package technique. For the reasons mentioned above, the trend of package technique is toward ball grid array (BGA), flip chip ball grid array (FC-BGA), chip scale package (CSP), Wafer level package (WLP) today. "Wafer level package" is to be understood as meaning that the entire packaging and all the interconnections on the wafer as well as other processing steps are carried out before the singulation (dicing) into chips (dice). Generally, after completion of all assembling processes or packaging processes, individual semiconductor packages are separated from a wafer having a plurality of semiconductor dice. The wafer level package has extremely small dimensions combined with extremely good electrical properties.

In the manufacturing method, wafer level chip scale package (WLCSP) is an advanced packaging technology, by which the die is manufactured and tested on the wafer, and then singulated by dicing for assembly in a surface-mount line. Because the wafer level package technique utilizes the whole wafer as one object, not utilizing a single chip or die, therefore, before performing a scribing process, packaging and testing has been accomplished; furthermore, WLP is such an advanced technique so that the process of wire bonding, die mount and under-fill can be omitted. By utilizing WLP technique, the cost and manufacturing time can be reduced, and the resulting structure of WLP can be equal to the die; therefore, this technique can meet the demands of miniaturization of electronic devices. Further, WLCSP has an advantage of being able to print the redistribution circuit directly on the die by using the peripheral area of the die as the bonding points. It is achieved by redistributing an area array on the surface of the die, which can fully utilize the entire area of the die. The bonding points are located on the redistribution circuit by forming flip chip bumps so the bottom side of the die connects directly to the printed circuit board (PCB) with micro-spaced bonding points.

Although WLCSP can greatly reduce the signal path distance, it is still very difficult to accommodate all the bonding points on the die surface as the integration of die and internal components gets higher. The pin count on the die increases as integration gets higher so the redistribution of pins in an area array is difficult to achieve. Even if the redistribution of pins is successful, the distance between pins will be too small to meet the pitch of a printed circuit board (PCB). That is to say, such process and structure of prior art will suffer yield and reliability issues owing to the huge size of package. The further disadvantage of former method are higher costs and time-consuming for manufacture.

WLP technique is an advanced packaging technology, by which the die are manufactured and tested on the wafer, and then the wafer is singulated by dicing for assembly in a surface-mount line. Because the wafer level package technique utilizes the whole wafer as one object, not utilizing a single chip or die, therefore, before performing a scribing process, packaging and testing has been accomplished; furthermore, WLP is such an advanced technique so that the process of wire bonding, die mount and under-fill can be omitted. By utilizing WLP technique, the cost and manufacturing time can be reduced, and the resulting structure of WLP can be equal to the die; therefore, this technique can meet the demands of miniaturization of electronic devices.

Though the advantages of WLP technique mentioned above, some issues still exist influencing the acceptance of WLP technique. For instance, the coefficient of thermal expansion (CTE) difference (mismatching) between the materials of a structure of WLP and the mother board (PCB) becomes another critical factor to mechanical instability of the structure. A package scheme disclosed by U.S. Pat. No. 6,271,469 suffers the CTE mismatching issue. It is because the prior art uses silicon die encapsulated by molding compound. As known, the CTE of silicon material is 2.3, but the CTE of molding compound is around 20-80. The arrangement causes chip location be shifted during process due to the curing temperature of compound and dielectric layers materials are higher and the inter-connecting pads will be shifted that will causes yield and performance problem. It is difficult to return the original location during temperature cycling (it caused by the epoxy resin property if the curing Temp near/over the Tg). It means that the prior structure package can not be processed by large size, and it causes higher manufacturing cost.

Further, some technical involves the usage of die that directly formed on the upper surface of the substrate. As known, the pads of the semiconductor die will be redistributed through redistribution processes involving a redistribution layer (RDL) into a plurality of metal pads in an area array type. The build up layer will increase the size of the package. Therefore, the thickness of the package is increased. This may conflict with the demand of reducing the size of a chip.

Moreover, the prior art suffers complicated process to form the "Panel" type package. It needs the mold tool for encapsulation and the injection of mold material. It is unlikely to control the surface of die and compound at same level due to warp after heat curing the compound, the CMP process may be needed to polish the uneven surface. The cost is therefore increased.

In view of the aforementioned, the present invention provides a new structure having multi-chips with side-by-side configuration and method for a panel level package (PLP) to overcome the above drawback.

SUMMARY OF THE INVENTION

The present invention will descript some preferred embodiments. However, it is appreciated that the present invention can extensively perform in other embodiments except for these detailed descriptions. The scope of the present invention is not limited to these embodiments and should be accorded the following claims.

One objective of the present invention is to provide a structure of semiconductor device package and method of the same, which can provide a new structure of super thin package.

Another objective of the present invention is to provide a structure of semiconductor device package and method of the same, which can allow a better reliability due to the substrate and the PCB have the same coefficient of thermal expansion (CTE).

Still another objective of the present invention is to provide a structure of semiconductor device package and method of the same, which can provide a simple process for forming a semiconductor device package.

Yet another objective of the present invention is to provide a structure of semiconductor device package and method of the same, which can lower cost and higher yield rate.

Another objective of the present invention is to provide a structure of semiconductor device package and method of the same, which can provide a good solution for low pin count device.

The present invention provides a structure of semiconductor device package comprising a substrate with die receiving through holes, connecting through holes structure and first contact pads on an upper surface and second contact pads on a lower surface of the substrate; a first die having first bonding pads and a second die having second bonding pads disposed within the die receiving through holes, respectively; a first adhesion material formed under the first die and the second die, wherein the second contact pads are formed on the lower surface of the first adhesion material; a second adhesion material filled in the gap between the first and second die and sidewalls of the die receiving though holes of the substrate; bonding wires formed to couple between the first bonding pads and the first contact pads, between the second bonding pads and the first contact pads; and a dielectric layer formed on the bonding wires, the first die, the second die and the substrate. Next, a build up layers are formed on the lower surface of substrate and the back side of the first die and the second die; to form the RDL and ball array on the lower side.

The present invention provides a method for forming a semiconductor device package comprising providing a substrate with die receiving through holes, connecting through holes structure and first contact pads on an upper surface and second contact pads on a lower surface of the substrate; redistributing a first die having first bonding pads and a second die having second bonding pads on a die redistribution tool with desired pitch by a pick and place fine alignment system; bonding the substrate to the die redistribution tool; filling a first adhesion material on the back side of the first die and the second die, wherein the second contact pads are formed on the lower surface of the first adhesion material; filling a second adhesion material into the space between the first and second die edge and the die receiving through holes of the substrate; separating the package structure from the die redistribution tool; forming bonding wires to connect the first bonding pads and the first contact pads, and the second bonding pads and the first contact pads; printing a dielectric layer on the active surface of the first die, the second die and upper surface of the substrate; forming build up layers (RDL and ball array) on the lower surface of the substrate, the back side of first die, the back side of second die (or the first adhesion material); and mounting the package structure on a tape to saw into individual die for singulation.

The present invention provides a method for forming a semiconductor device package comprising providing a substrate with die receiving through holes, connecting through holes structure and first contact pads on an upper surface and second contact pads on a lower surface of the substrate; bonding the substrate to a die redistribution tool; redistributing a first die having first bonding pads and a second bonding pads having second bonding pads on the die redistribution tool with desired pitch by a pick and place fine alignment system; forming bonding wires to connect the first bonding pads and the first contact pads, and the second bonding pads and the first contact pads; forming a dielectric layer on the active surface of the first and second die and upper surface of the substrate and fill into the gap between die edge and sidewall of the die receiving through holes of the substrate; separating the package structure from said die redistribution tool; forming build up layers (RDL and ball array) on the lower surface of the substrate, the back side of first die, the back side of second die (or the first adhesion material); and mounting the package structure on a tape to saw into individual die for singulation.

BRIEF DESCRIPTION OF THE DRAWINGS

The foregoing aspects and many of the attendant advantages of this invention will become more readily appreciated as the same becomes better understood by reference to the following detailed description, taken in conjunction with the accompanying drawings, wherein.

DESCRIPTION OF THE PREFERRED EMBODIMENT

In the following description, numerous specific details are provided in order to give a through understanding of embodiments of the invention. Referring now to the following description wherein the description is for the purpose of illustrating the preferred embodiments of the present invention only, and not for the purpose of limiting the same. One skilled in the relevant art will recognize, however, that the invention may be practiced without one or more of the specific details, or with other methods, components, materials, etc.

Figure 1:
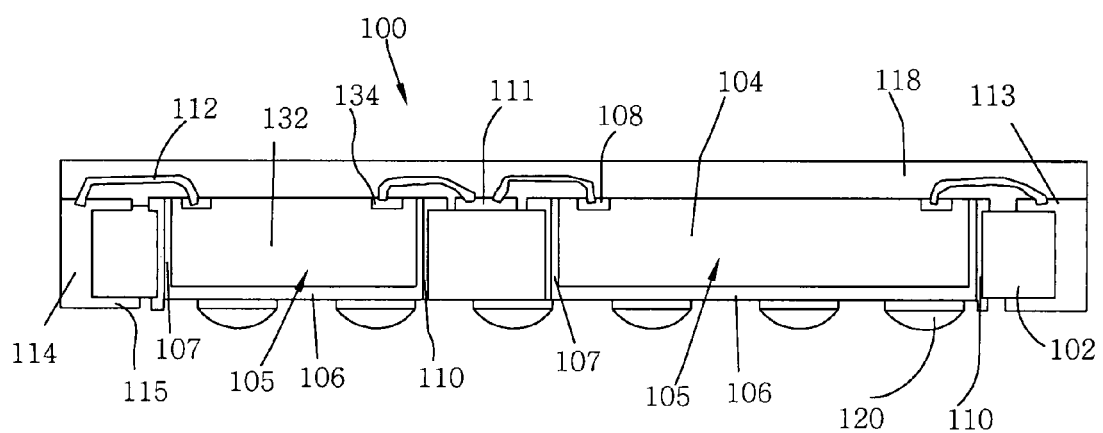
FIG. 1 illustrates a cross-section diagram of a structure of semiconductor device package according to the present invention.

Referring to FIG. 1, it is a cross-section diagram of a structure of semiconductor device package 100 according to one of the embodiments of the present invention. The package 100 comprises a substrate 102 having a first die 104 and a second die 132. In FIG. 1, the substrate 102 has die receiving through holes 105 formed therein for receiving the first die 104 and the second die 132. The die receiving through holes 105 are formed from the upper surface of the substrate 102 through the substrate 102 to the lower surface. The die receiving through holes 105 are pre-formed within the substrate 102. The second adhesion material 107 is also refilled within the space between the edge of first die 104 and the second die 132 and the sidewalls of the die receiving through holes 105. The first adhesion material 106 is coated (or taped) on the lower surface of the first die 104 and the second die 132, respectively. It maybe uses the same material for both the first adhesion material 106 and the second adhesion material 107.

The substrate 102 further comprises the connecting through holes structure 114 formed therein. The first contact pads 113 and the second contact pads 115 (for organic substrate) are respectively formed on the upper surface and lower surface of the connecting through holes structure 114 and partial part of the upper surface and lower surface of the substrate 102. The conductive material is re-filled into the connecting through holes structure 114 for electrical connection.

Optional, a metal or conductive layer 110 is coated on the sidewall of the die receiving through holes 105, that is to say, the metal layer 110 is formed between the first die 104 surrounding by the second adhesion material 107 and the substrate 102, and between the second die 132 surrounding by the second adhesion material 107 and the substrate 102. It can improve the adhesion strength between die edge and sidewall of the die receiving through holes 105 of the substrate 102 by using some particular adhesion materials, especially for the rubber type adhesion materials.

The first die 104 and the second die 132 are respectively disposed within the die receiving through holes 105 on the substrate 102. As know, first bonding pads 108 are formed within the upper surface of the first die 104, and the second bonding pads 134 are formed within the upper surface of the second die 132. The bonding wires 112 are coupled between the first bonding pads 108 and the first contact pads 113, between the second bonding pads 134 and the first contact pads 113. A dielectric layer 118 is formed on the upper surface to cover the bonding wires 112 and the upper surface of the first die 104, the second die 132 and the substrate 102. Next, a build up layers are formed on the lower surface of substrate 102 and the back side of the first die 104 and the second die 132. Then, a plurality of conductive bumps 120 are formed on the lower surface via the method of printing the solder paste on the surface, followed by performing re-flow process to reflow the solder paste. The conductive bumps 120 maybe coupled to the second contact pads 115. Accordingly, the first die 104 and the second die can be electrically connected with the conductive bumps 120 through the connecting through holes structure 114.

The dielectric layer 118 is employed to prevent the package from external force that may causes damage to the package. The metal layer 110 and the second adhesion material 107 act as buffer areas that absorb the thermal mechanical stress between the first, second die 104, 132 and substrate 102 during temperature cycling due to the second adhesion material 107 has elastic property. The aforementioned structure constructs ball grid array (BGA) type package.

In one embodiment, the material of the substrate 102 includes epoxy type FR5, FR4 or BT (Bismaleimide triazine epoxy). The material of the substrate 102 also can be metal, alloy, glass, silicon, ceramic or print circuit board (PCB). The alloy further includes alloy 42 (42% Ni-58% Fe) or Kovar (29% Ni-17% Co-54% Fe). Further, the alloy metal is preferably composed by alloy 42 that is a nickel iron alloy whose coefficient of expansion makes it suitable for joining to silicon chips in miniature electronic circuits and consists of nickel 42% and ferrous (iron) 58%. The alloy metal also can be composed by Kovar which consists of nickel 29%, cobalt 17% and ferrous (iron) 54%.

Preferably, the material of the substrate 102 is organic substrate likes epoxy type FR5, BT, PCB with defined through holes or Cu metal with pre etching circuit. Preferably, the coefficient of thermal expansion (CTE) is the same as the one of the mother board (PCB), and then the present invention can provide a better reliability structure due to the CTE of the substrate 102 is matching with the CTE of the PCB (or mother board) accordingly. Preferably, the organic substrate with high Glass transition temperature (Tg) are epoxy type FR5 or BT (Bismaleimide triazine) type substrate. The Cu metal (CTE around 16) can be used also. The glass, ceramic, silicon can be used as the substrate. The second adhesion material 107 is formed of silicone rubber elastic materials.

In one embodiment, the material of the first adhesion material 106 and the second adhesion material 107 include Siloxane polymer (SINR), WL5000, rubber, epoxy, liquid compound and polyimide (PI). The first adhesion material 106 also can be included the metal material. Further, the material of the dielectric layer 118 includes liquid compound, resin, silicone rubber and epoxy type compound.

Figure 2:
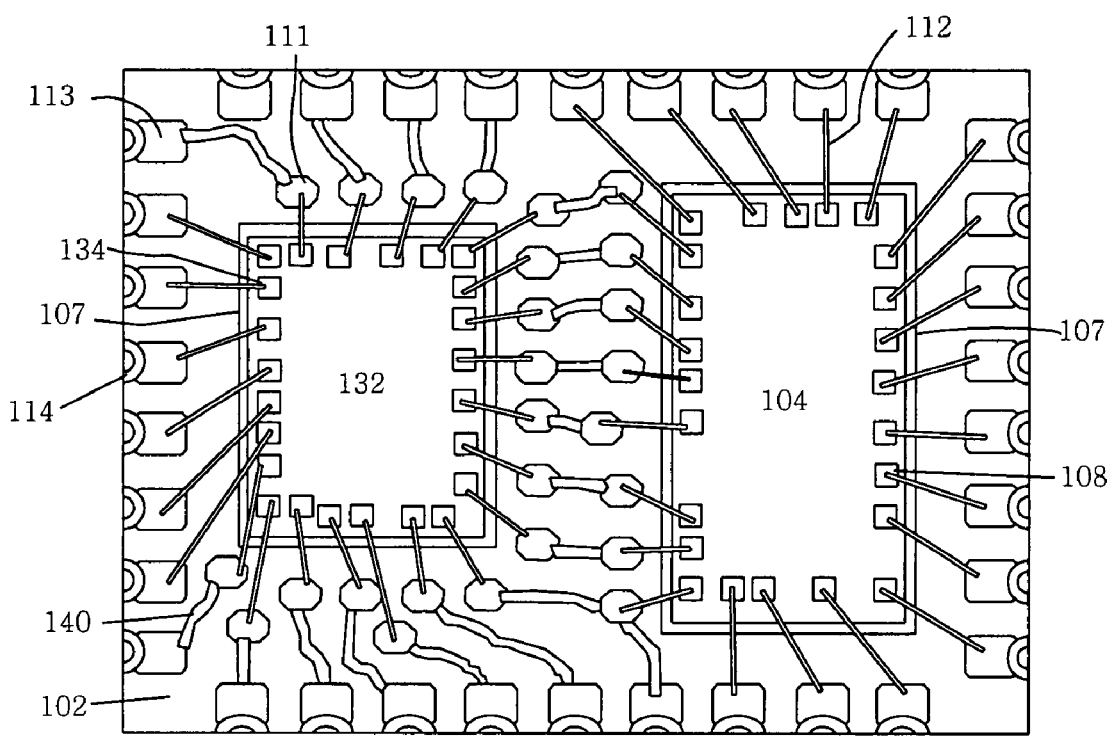
FIG. 2 illustrates a top view diagram of a structure of semiconductor device package according to the present invention.

Referring to FIG. 2, it is a top view diagram of a structure of semiconductor device package 100 according to the present invention. The top side of package 100 includes the substrate 102, the first die 104 having first bonding pads 108 and the second die 132 having second bonding pads 134. The first and second dice 104, 132 are formed on the first adhesion material 106. A plurality of first contact pads 113 are formed around the edge of the substrate 102, and the peripheral portions of the first die 104 and the second die 132. Further, the package 100 further comprises a plurality of bonding wires 112 to couple the first bonding pads 108, the second bonding pads 132 and the first contact pads 113. It is noted that the bonding wires 112 are invisible after the formation of the dielectric layer 118.

Further, the present invention includes the wiring circuits 140 to couple the first contact pads 113 formed among the peripheral portions of the first and second die 104 and 132. In other words, the first contact pads 113 formed and surrounded on the edge areas of the substrate 102 can be electrically coupled to the first contact pads 113 formed between the first and second die 104 and 132 by the wiring circuits 140.

Figure 3:
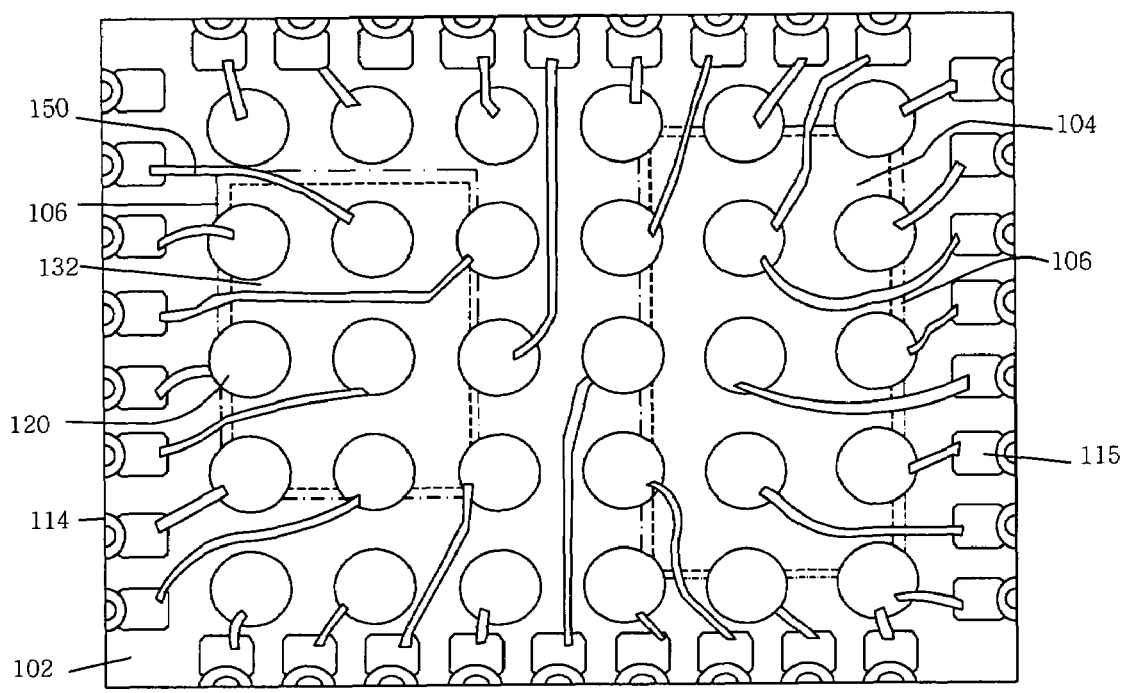
FIG. 3 illustrates a bottom view diagram of a structure of semiconductor device package according to the present invention.

In FIG. 3, illustrates is a bottom view diagram of a structure of semiconductor device package 100 according to the present invention. The back side of the package 100 includes the substrate 102 (the solder mask layer is not showed on the drawing) and the second adhesion layer 107 formed therein and surrounded by a plurality of second contact pads 115. The package 100 comprises the first adhesion material 106 that includes a metal sputtering and/or electro-plating on back side of the first die 104, the second die 132 and the second adhesion material 107 to enhance the thermal conductivity, as shown in the tight-dotted area. In a preferred embodiment, the metal sputtering on the back side of the die includes Ti/Cu, and the metal electric-plating on the back side of the die includes Cu/Ni/Au. It can be solder join with printed circuit board (PCB) by solder paste, it can exhaust the heat (generate by the dice) through the copper metal of print circuit board.

Moreover, the present invention also includes the redistributed layer (RDL) traces 150 formed on the lower surface for coupling between the second contact pads 115 and the conductive bumps 120. In other words, the first die 104 and the second die 132 can be electrically connected to the conductive bumps 120 through the connecting through holes structure 114 and the redistributed layer (RDL) traces 150.

Figure 4:
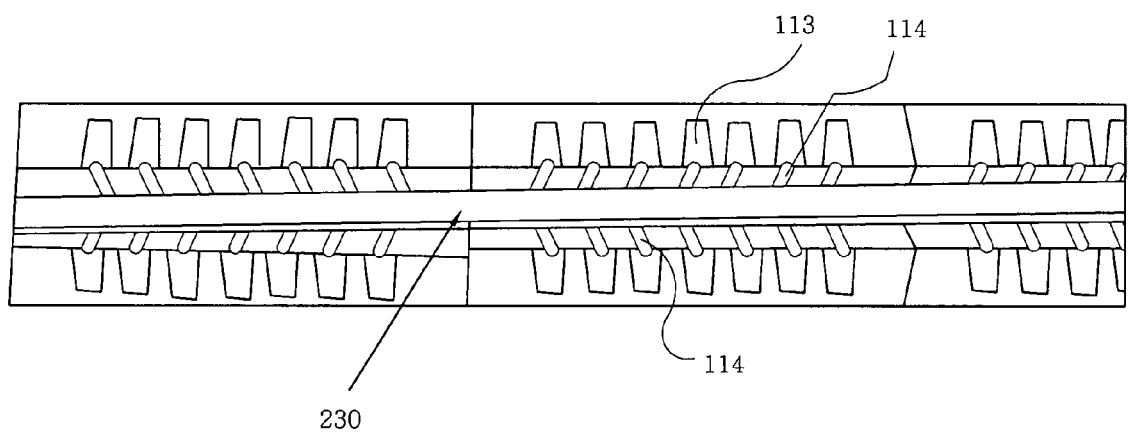
FIG. 4 illustrates a cross-section diagram of a structure of semiconductor device package according to the present invention.

Refer to FIG. 4, it illustrates a cross-section diagram of a structure of semiconductor device package 100 according to the present invention. The first contact pads 113 are formed over the connecting through holes structure 114. The connecting through holes structure 114 is located in the scribe line 230. In other words, each package has half through holes structure 114 after sawed. It can improve the solder join quality during SMT process and also can reduce the foot print. Similarly, the structure of half through holes structure 114 can be formed on the sidewall of the die receiving through holes 105 (not show in the drawing), it can replace the conductive layer 110. Otherwise, the package 100 also can be applied to higher pin counts. Therefore, the peripheral type format of the present invention can provide a good solution for low pin count device.

According to the aspect of the present invention, the present invention further provides a method for forming a semiconductor device package 100 with the die receiving through holes 105 and the connecting through holes structure 114.

First, the substrate 102 with the die receiving through holes 105, connecting through holes structure 114 and the first contact pads 113 on an upper surface and the second contact pads 115 on a lower surface of the substrate 102 is provided, wherein the die receiving through holes 105, the connecting through holes structure 114, the first contact pads 113 and the second contact pads 115 are preformed within the substrate 102. The first die 104 having first bonding pads 108 and the second die 132 having second bonding pads 134 are redistributed on a die redistribution tool (not shown) with desired pitch by a pick and place fine alignment system. The substrate 102 is bonding to the die redistribution tool, that is to say, the active surface of the first die 104 and the second die 132 are respectively sticking on the die redistribution tool printed by patterned glues (not shown). After the second adhesion material 107 filled into the space between the first, second die 104, 132 and the first adhesion material 106 on back side of the first, second die 104, 132, the first and second adhesion material 106 and 107 are cured. In one embodiment, it may be the same materials for the first adhesion material 106 and the second adhesion material 107. Then, the package structure is separated from the die redistribution tool.

After cleaning the top surface of the first bonding pads 108 and the first contact pads 113 (the pattern glues may residue on the surface of bonding pads 108 and first contact pads 113) and the second bonding pads 134 and the first contact pads 113, the bonding wires 112 are formed to connect the first bonding pads 108 to the first contact pads 113 and the second bonding pads 134 and the first contact pads 113. The dielectric layer 118 is coated (or print or dispensing) and cured on the active surface of the first, second die 104, 132 and upper surface of the substrate 102 in order to protect the bonding wires 112, the first die 104, the second die 132 and the substrate 102. Next, a build up layers are formed on the lower surface of substrate 102 and the back side of the first die 104 and the second die 132; to form the RDL and ball array on the lower side. Then, the terminal contact pads are formed on the second contact pads 115 by printing the solder paste (or ball). Then, the plurality of conductive bumps 120 are formed by an IR reflow method and coupled to the second contact pads 115. Subsequently, the package structure is mounting on a tape to saw into individual die for singulation.

Optionally, a metal or conductive layer 110 is formed on the sidewall of die receiving through holes 105 of the substrate 102, and the metal is pre-formed during the manufacture of the substrate. A metal film (or layer) can be sputtered or plated on the back side of the first and second die 104 and 132 as the first adhesion material 106 for better thermal management inquiry.

According to another aspect of the present invention, the present invention also provides another method for forming a semiconductor device package 100. The steps comprises providing a substrate 102 with die receiving through holes 105, connecting through holes structure 115, the first contact pads 113 on an upper surface and the second contact pads 115 on a lower surface of the substrate 102. The substrate 102 is bonding to a die redistribution tool. In other words, the active surface (for solder join) of the substrate 102 is sticking on the die redistribution tool printed by patterned glues (not shown). The first die 104 has the first bonding pads 108 and the second die 132 has the second bonding pads 134. The first adhesion material 106 (optional) is formed on the back side of the first die 104 and the second die 132. The first and second die 104 and 132 are redistributed on the die redistribution tool with desired pitch by a pick and place fine alignment system. Then, the bonding wires 112 are formed to connect the first bonding pads 108 to the first contact pads 113, and the second bonding pads 134 to the first contact pads 113.

Next, the dielectric layer 118 is formed on the active surface of the first, second die 104, 132 and upper surface of the substrate 102 to fully cover the bonding wires 112 and fill into the gap between die edge and sidewall of die receiving through holes 105 as second adhesion material 107, and the dielectric layer 118 is cured. After the package structure separated from the die redistribution tool, the back side of the substrate 102 and the first adhesion material 106 are cleaned.

Alternatively, the terminal contact pads are formed on the second contact pads 115 by printing the solder paste (or ball), a build up layers are formed on the lower surface of substrate 102 and the back side of the first die 104 and the second die 132; to form the RDL and ball array on the lower side. Optionally, the plurality of conductive bumps 120 are formed and coupled to the second contact pads 115. Subsequently, the package structure 100 is mounted on a tape to saw into individual die for die singulation.

In one embodiment, a conventional sawing blade, is used during the singulation process. The blade is aligned to the scribe line 230 to separate the dice into individual die during the singulation process.

Optional, a metal or conductive layer 110 is formed on the sidewall of die receiving through holes 105 of the substrate 102, it is the pre-formed process during making the substrate 102. Another process is making the first adhesion material 106 by using the steps including seed metal sputtering, patterning, electro-plating (Cu), PR striping, metal wet etching process, etc. to achieve the first adhesion materials 106 as metal layer after.

In one embodiment, the step of forming the conductive bumps 120 is performed by an infrared (IR) reflow method.

It is noted that the material and the arrangement of the structure are illustrated to describe but not to limit the present invention. The material and the arrangement of the structure can be modified according to the requirements of different conductions.

According to the aspect of the present invention, the present invention provides a structure of semiconductor device having multi-chips with side-by-side configuration that provides a structure of super thin package which the thickness is less than 200 μm. The package size can be adjustable according to the sizes of the multi-chips. Further, the present invention provides a good solution for low pin count device due to the peripheral type format. The present invention provides a simple method for forming a semiconductor device package which can improve the reliability and yield. Moreover, the present invention further provides a new structure that has multi-chips with side-by-side configuration, and can minimize the size of chip scale package structure and reduce the costs due to the lower cost material and the simple process. Therefore, the super thin chip scale package structure and method of the same disclosed by the present invention can provide unexpected effect than prior art, and solve the problems of prior art. The method may apply to wafer or panel industry and also can be applied and modified to other related applications.

As will be understood by a person skilled in the art, the foregoing preferred embodiments of the present invention are illustrative of the present invention, rather than limiting the present invention. Having described the invention in connection with a preferred embodiment, modification will suggest itself to those skilled in the art. Thus, the invention is not to be limited by this embodiment. Rather, the invention is intended to cover various modifications and similar arrangements included within the spirit and scope of the appended claims, the scope of which should be accorded the broadest interpretation so as to encompass all such modifications and similar structures.

What is claimed is:

1. A structure of semiconductor device package, comprising:
   a substrate with die receiving through holes, connecting through holes structure and first contact pads on an upper surface and second contact pads on a lower surface of said substrate;
   a first die having first bonding pads and a second die having second bonding pads disposed within said die receiving through holes, respectively;
   a first adhesion material formed under said first die and said second die;
   a second adhesion material filled in the gap between said first and second die and sidewalls of said die receiving though holes of said substrate;
   bonding wires formed to couple between said first bonding pads and said first contact pads, between said second bonding pads and said first contact pads; and
   a dielectric layer formed on said bonding wires, said first die, said second die and said substrate.

2. The structure in claim 1, further comprising a plurality of conductive bumps formed on said lower surface and coupled to said second contact pads.

3. The structure in claim 2, further comprising RDL (redistributed layer) traces coupled between said conductive bumps and said second contact pads.

4. The structure in claim 2, wherein said plurality of conductive bumps can be electrically connected with said first bonding pads and said second bonding pads through said through holes structure.

5. The structure in claim 1, further comprising a metal or conductive layer formed on side walls of said die receiving through hole of said substrate.

6. The structure in claim 1, wherein said connecting through holes structure is formed to pass through said substrate.

7. The structure in claim 1, wherein said connecting through holes structure is formed lateral side of said substrate.

8. The structure in claim 1, wherein material of said substrate includes epoxy type FR5, FR4 or BT (Bismaleimide triazine).

9. The structure in claim 1, wherein material of said substrate includes metal, alloy, glass, silicon, ceramic or print circuit board (PCB).

10. The structure in claim 9, wherein said alloy includes alloy 42 (42%Ni-58%Fe) or Kovar (29%Ni-17%Co-54%Fe).

11. The structure in claim 1, wherein material of said first adhesion material and said second adhesion material include Siloxane polymer (SINR), WL5000, rubber, epoxy, liquid compound and polyimide (PI).

12. The structure in claim 1, wherein said connecting through holes structure are filled by a conductive material.

13. The structure in claim 1, wherein material of said dielectric layer include liquid compound, resin, silicone-rubber and epoxy type compound.

14. The structure in claim 1, further comprising a metal layer sputtering and/or electro-plating on back side of said first die and said second die.

15. The structure in claim 1, further comprising wiring circuit to couple said first contact pads formed among the peripheral portions of said first die and said second die.

16. The structure in claim 1, further comprising build up layers to couple (RDL and ball array) said second contact pads formed among the lower surface of said substrate and back side of said first die and said second die.

* * * * *